(12) United States Patent
Hirata et al.

(10) Patent No.: US 11,469,094 B2
(45) Date of Patent: *Oct. 11, 2022

(54) METHOD OF PRODUCING WAFER

(71) Applicant: DISCO CORPORATION, Tokyo (JP)

(72) Inventors: Kazuya Hirata, Tokyo (JP); Ryohei Yamamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 863 days.

This patent is subject to a terminal disclaimer.

(21) Appl. No.: 16/371,302

(22) Filed: Apr. 1, 2019

(65) Prior Publication Data

US 2019/0304769 A1 Oct. 3, 2019

(30) Foreign Application Priority Data

Apr. 3, 2018 (JP) .............................. JP2018-071653

(51) Int. Cl.
*H01L 21/02* (2006.01)
*H01L 29/16* (2006.01)

(52) U.S. Cl.
CPC .... *H01L 21/02013* (2013.01); *H01L 29/1608* (2013.01)

(58) Field of Classification Search
CPC ........... H01L 21/02013; H01L 29/1608; H01L 21/02021; H01L 21/78; H01L 21/02002; H01L 21/02123; H01L 21/268; B23K 26/0823; B23K 2101/40; B23K 2103/52; B23K 2103/56; B23K 26/0622; B23K 26/0853; B23K 26/0876; B23K 26/53; B23K 37/0408; B23K 26/0006;

(Continued)

(56) References Cited

U.S. PATENT DOCUMENTS

| | | | | |
|---|---|---|---|---|
| 9,815,138 | B2* | 11/2017 | Hirata | B23K 26/0604 |
| 10,755,946 | B2* | 8/2020 | Hirata | C30B 29/36 |
| 2012/0223335 | A1* | 9/2012 | Tsuchiya | B23K 26/389 |
| | | | | 257/77 |

FOREIGN PATENT DOCUMENTS

| JP | 2000094221 A | 4/2000 |
|---|---|---|
| JP | 2013049161 A | 3/2013 |

OTHER PUBLICATIONS

Kazuya Hirata et al.; U.S. Appl. No. 16/192,250, filed Nov. 15, 2018.

(Continued)

*Primary Examiner* — Cuong B Nguyen
(74) *Attorney, Agent, or Firm* — Greer Burns & Crain Ltd.

(57) ABSTRACT

A method of producing a wafer from a hexagonal single-crystal ingot includes the steps of planarizing an end face of the hexagonal single-crystal ingot, forming a peel-off layer in the hexagonal single-crystal ingot by applying a pulsed laser beam whose wavelength is transmittable through the hexagonal single-crystal ingot while positioning a focal point of the pulsed laser beam in the hexagonal single-crystal ingot at a depth corresponding to a thickness of a wafer to be produced from the planarized end face of the hexagonal single-crystal ingot, recording a fabrication history on the planarized end face of the hexagonal single-crystal ingot by applying a pulsed laser beam to the hexagonal single-crystal ingot while positioning a focal point of the last-mentioned pulsed laser beam in a device-free area of the wafer to be produced.

3 Claims, 10 Drawing Sheets

(58) Field of Classification Search
CPC ......... C30B 29/36; C30B 33/00; C30B 33/06;
B28D 5/0011
See application file for complete search history.

(56) References Cited

OTHER PUBLICATIONS

Kazuya Hirata et al.; U.S. Appl. No. 16/926,851, filed Jul. 13, 2020.

* cited by examiner

METHOD OF PRODUCING WAFER

BACKGROUND OF THE INVENTION

Field of the Invention

The present invention relates to a method of producing a wafer from a hexagonal single-crystal ingot.

Description of the Related Art

Devices such as integrated circuits (ICs), large scale integration (LSI) circuits, light emitting diodes (LEDs), etc. are formed on a wafer of Si (silicon), $Al_2O_3$ (sapphire), or the like by depositing a function layer on the face side of the wafer and demarcating the face side into a plurality of areas by a grid of projected dicing lines. Power devices, LEDs, or the like are formed on a wafer of single-crystal SiC (silicon carbide) by depositing a function layer on the face side of the wafer and demarcating the face side into a plurality of areas by a grid of projected dicing lines. A wafer with devices formed thereon is divided into individual device chips along projected dicing lines by a cutting apparatus, a laser processing apparatus, or the like. The produced device chips will be used in electric appliances such as mobile phones, personal computers, and so on.

A wafer on which devices are to be formed is generally produced by cutting a thin slice off a cylindrical semiconductor ingot with a wire saw. The wafer thus produced has its face and reverse sides polished to a mirror finish (see, for example, Japanese Patent Laid-Open No. 2000-94221). Such a customary step of slicing wafers off a semiconductor ingot with a wire saw and polishing the face and reverse sides of the wafers is not economic because most (70% through 80%) of the semiconductor ingot is wasted. In particular, ingots of hexagonal single-crystal SiC are difficult to cut with a wire saw as they are hard, are poor in productivity as they take considerable time to cut, and pose problems in producing wafers efficiently as they are expensive to obtain.

There has been proposed a technology in which a laser beam having a wavelength transmittable through hexagonal single-crystal SiC is applied to an ingot of hexagonal single-crystal SiC while positioning its focal point within the ingot, thereby forming a peel-off layer at a projected severance plane in the ingot, and a wafer is peeled off from the ingot along the projected severance plane (see, for example, Japanese Patent Laid-Open No. 2013-49161).

SUMMARY OF THE INVENTION

However, the history of a wafer produced from a hexagonal single-crystal ingot is not necessarily clear, and even if defects occur in devices on the wafer during a step of forming the devices on the wafer, it is not possible to examine the cause of the defects by looking back on the ingot based on the history of the wafer.

This problem also tends to arise when a wafer is produced from a hexagonal single-crystal ingot by cutting the ingot with a wire saw and when a wafer is produced from a hexagonal single-crystal ingot by cutting the ingot with an inner saw. One problem is that it is difficult to link a wafer to a hexagonal single-crystal ingot once the wafer is severed from the ingot.

It is therefore an object of the present invention to provide a method of producing a wafer from a hexagonal single-crystal ingot while linking the history of the wafer to the hexagonal single-crystal ingot and reliably leaving the history in the wafer.

In accordance with an aspect of the present invention, there is provided a method of producing a wafer from a hexagonal single-crystal ingot, including the steps of planarizing an end face of the hexagonal single-crystal ingot, forming a peel-off layer in the hexagonal single-crystal ingot by applying a pulsed laser beam whose wavelength is transmittable through the hexagonal single-crystal ingot while positioning a focal point of the pulsed laser beam in the hexagonal single-crystal ingot at a depth corresponding to a thickness of a wafer to be produced from the planarized end face of the hexagonal single-crystal ingot, recording a fabrication history on the planarized end face of the hexagonal single-crystal ingot by applying a pulsed laser beam to the hexagonal single-crystal ingot while positioning a focal point of the last-mentioned pulsed laser beam in a device-free area of the wafer to be produced, and producing the wafer by peeling off the wafer from the hexagonal single-crystal ingot along the peel-off layer that serves as a severance starting point.

Preferably, the fabrication history recorded in the step of a fabrication history represents a lot number of the hexagonal single-crystal ingot, a serial number of the wafer to be produced from the hexagonal single-crystal ingot, a date on which the wafer is fabricated, a factory where the wafer is fabricated, or the type of fabrication equipment involved in the fabrication of the wafer.

Preferably, the hexagonal single-crystal ingot includes a hexagonal single-crystal SiC ingot having a first end face, a second end face opposite the first end face, a c-axis extending from the first end face to the second end face, and a c-plane perpendicular to the c-axis, the c-axis being inclined to a line normal to the first end face, and the c-plane and the first end face forming an off-angle therebetween. The step of forming a peel-off layer includes the steps of positioning a focal point of a pulsed laser beam whose wavelength is transmittable through the hexagonal single-crystal SiC ingot in the hexagonal single-crystal SiC ingot at a depth corresponding to a thickness of a wafer to be produced from the first end face of the hexagonal single-crystal SiC ingot, moving the hexagonal single-crystal SiC ingot and the focal point relatively to each other in a direction perpendicular to a direction in which the off-angle is formed, thereby to separate SiC in the hexagonal single-crystal SiC ingot into Si and C and to absorb a subsequently applied pulsed laser beam with previously formed C, thereby forming a modified region where SiC is successively separated into Si and C and a succession of cracks extending along the c-plane from the modified region, and indexing-feeding the hexagonal single-crystal SiC ingot and the focal point relatively to each other by a predetermined distance in the direction in which the off-angle is formed thereby to form the peel-off layer in the hexagonal single-crystal SiC ingot.

According to the present invention, the history of the produced wafer that is linked to the hexagonal single-crystal ingot is reliably left on the wafer, and hence can be confirmed during a step of forming devices on the wafer. If defects occur in devices on the wafer, then it is possible to examine the cause of the defects by looking back on the hexagonal single-crystal ingot based on the history of the wafer. Therefore, preventive measures can be taken to prevent similar defects from occurring in devices on wafers.

The above and other objects, features and advantages of the present invention and the manner of realizing them will become more apparent, and the invention itself will best be

DETAILED DESCRIPTION OF THE PREFERRED EMBODIMENT

Figure 1A:
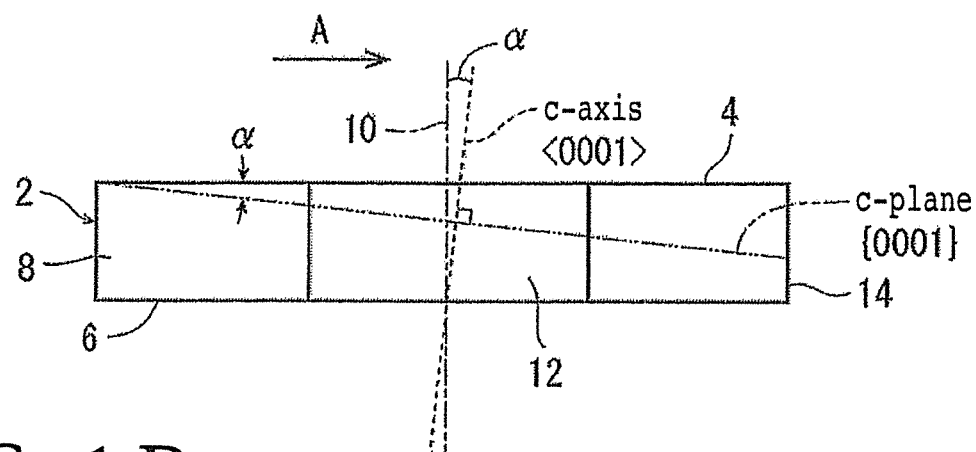
FIG. 1A is a front elevational view of an SiC ingot.
Figure 1B:
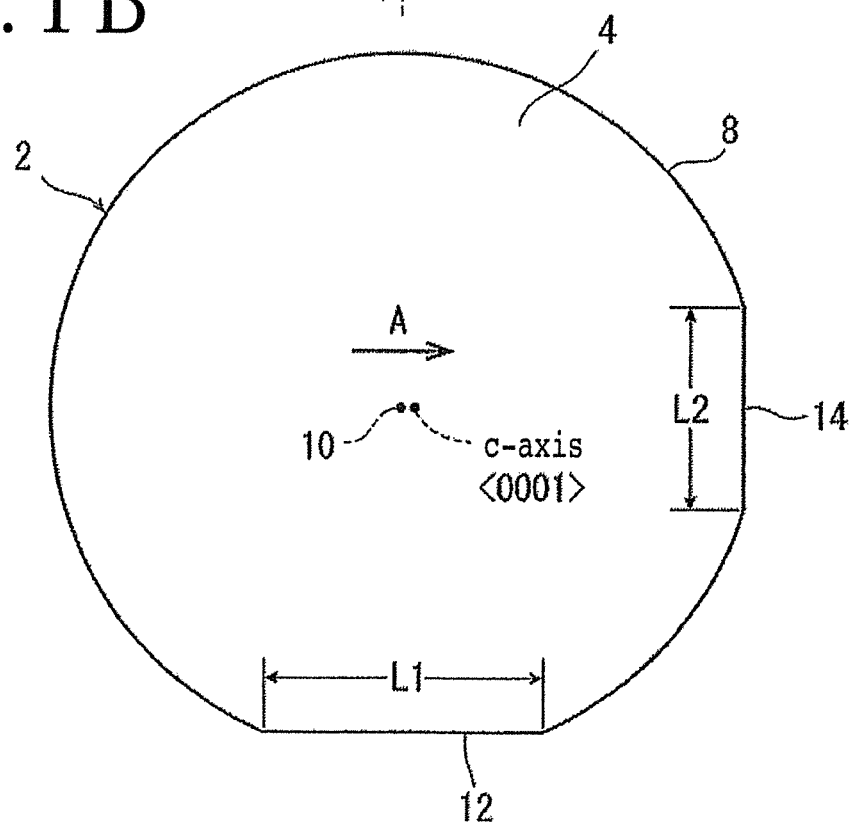
FIG. 1B is a plan view of the SiC ingot.

A method of producing a wafer according to an embodiment of the present invention will hereinafter be described below with reference to the drawings. FIGS. 1A and 1B illustrate a hexagonal single-crystal SiC ingot (hereinafter simply referred to as "ingot") 2 on which the method of producing a wafer according to the present embodiment is to be performed. The ingot 2 is made of hexagonal single-crystal SiC and has a cylindrical shape as a whole. The ingot 2 has a circular first end face 4, a circular second end face 6 opposite the first end face 4, a peripheral face 8 positioned between the first end face 4 and the second end face 6, a c-axis (<0001> direction) extending from the first end face 4 to the second end face 6, and a c-plane ({0001} plane) perpendicular to the c-axis. The c-axis is inclined to a line 10 normal to the first end face 4, and the c-plane and the first end face 4 form an off-angle α (e.g., α=1, 3, or 6 degrees) therebetween. The direction in which the off-angle α is formed is indicated by an arrow A in FIGS. 1A and 1B. The peripheral face 8 of the ingot 2 has a first orientation flat 12 and a second orientation flat 14, each of a rectangular shape, for indicating a crystal orientation. The first orientation flat 12 lies parallel to the direction A in which the off-angle α is formed, whereas the second orientation flat 14 lies perpendicularly to the direction A in which the off-angle α is formed. As depicted in FIG. 1B, a length L2 of the second orientation flat 14 is smaller than a length L1 of the first orientation flat 12, as viewed from above (L2<L1). The ingot on which the method of producing a wafer according to the present embodiment is to be performed is not limited to the above ingot 2, but may be an SiC ingot where the c-axis is not inclined to the line normal to the first end face and the off-angle α between the c-plane and the first end face is 0 degree, i.e., the line normal to the first end face and the c-axis are aligned with each other, or a hexagonal single-crystal ingot made of a material other than hexagonal single-crystal SiC, such as GaN (gallium nitride) or the like.

Figure 2A:
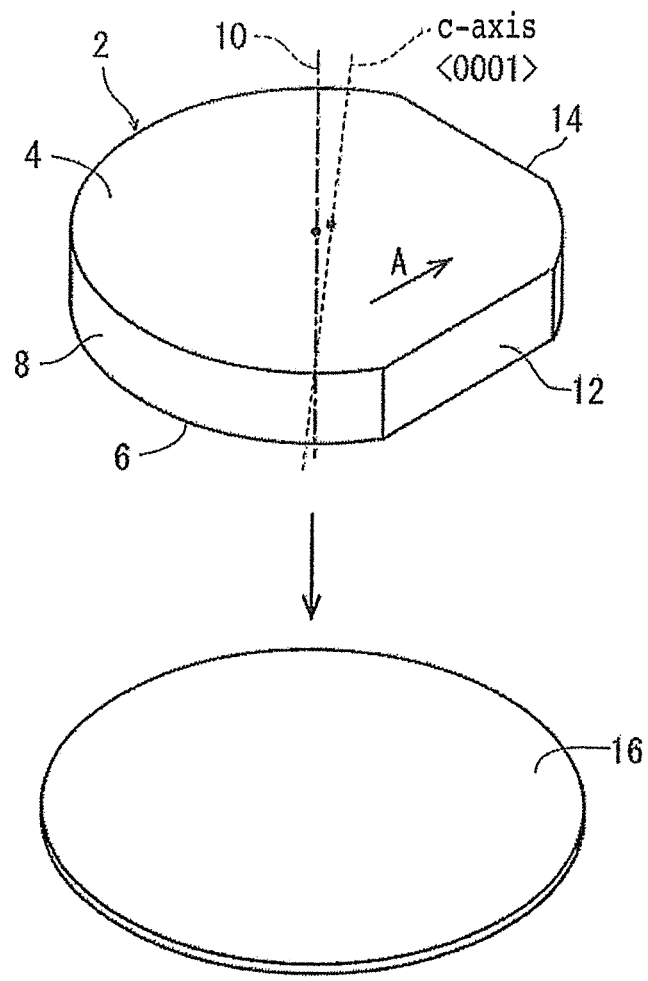
FIG. 2A is a perspective view of the SiC ingot and a substrate.
Figure 2B:
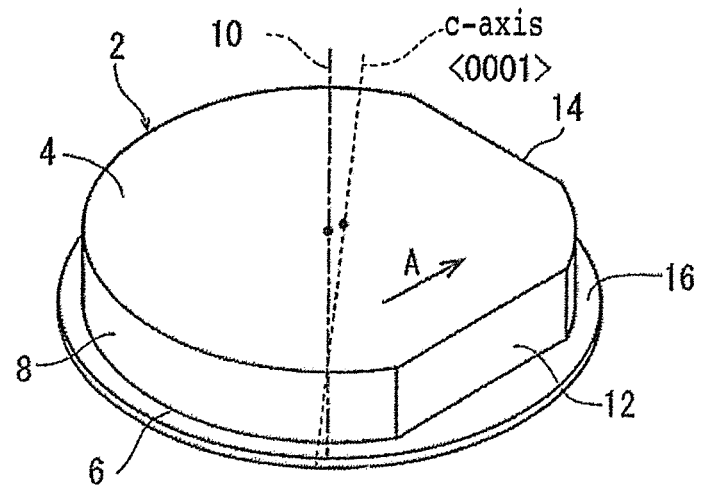
FIG. 2B is a perspective view of the SiC ingot and the substrate mounted thereon.

According to the present embodiment, as illustrated in FIGS. 2A and 2B, a substrate mounting step is carried out to mount a disk-shaped substrate 16 on the second end face 6 of the ingot 2 with a suitable adhesive interposed therebetween. The substrate mounting step is carried out in order that a circular suction chuck of each of the apparatus to be described later can hold the ingot 2 with the first orientation flat 12 and the second orientation flat 14 under predetermined suction forces. Since a diameter of the substrate 16 is slightly larger than a diameter of the suction chuck, the suction chuck has its upper surface covered with the substrate 16 when the ingot 2 is placed on the suction chuck with the substrate 16 facing downwardly, and hence the suction chuck can hold the ingot 2 with the first orientation flat 12 and the second orientation flat 14 under predetermined suction forces. If a diameter of the ingot 2 is larger than the suction chuck and the upper surface of the suction chuck is covered in its entirety by the ingot 2 when the ingot 2 is placed on the suction chuck, then when the suction chuck sucks the ingot 2, the upper surface of the suction chuck has no exposed area and no air is drawn into the suction chuck, so that the suction chuck can hold the ingot 2 under predetermined suction forces. Consequently, it is not necessary to mount the substrate 16 on the ingot 2 whose diameter is larger than the suction chuck.

After the substrate mounting step has been performed, a peel-off layer forming step is carried out to form a peel-off layer in the ingot 2 by applying a laser beam having a wavelength transmittable through the ingot 2 to the ingot 2 while positioning its focal point within the ingot 2 at a depth corresponding to a thickness of a wafer to be produced from a planarized end face of the ingot 2. Normally, the first end face 4 and the second end face 6 of the ingot 2 have been planarized to the extent that will not obstruct the entry of the laser beam into the ingot 2 in the peel-off layer forming step. Therefore, when the peel-off layer forming step is to be performed for the first time on the ingot 2, it is not necessary to perform a planarizing step to planarize the end faces of the ingot 2.

Figure 3:
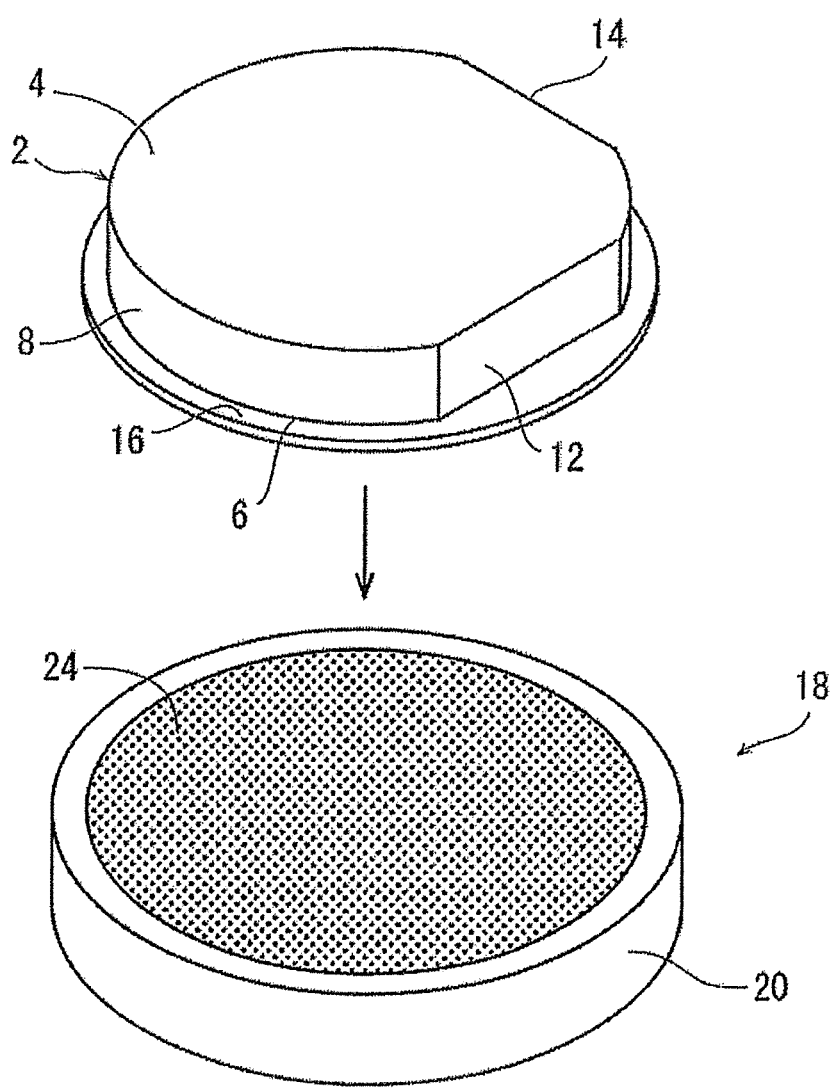
FIG. 3 is a perspective view illustrating the manner in which the SiC ingot is being placed on a chuck table of a laser processing apparatus.
Figure 4A:
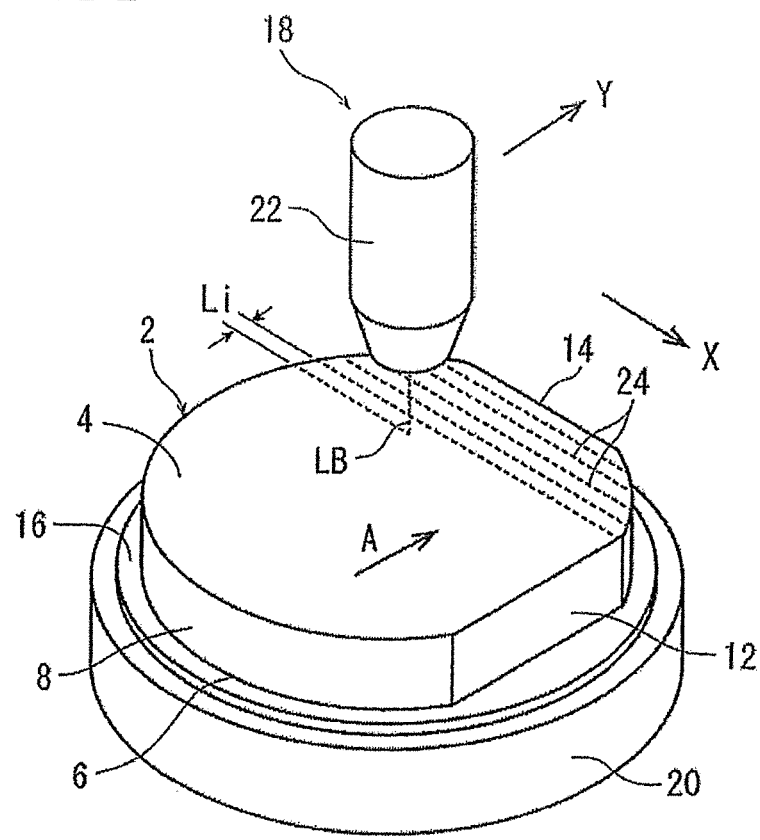
FIG. 4A is a perspective view illustrating a peel-off layer forming step performed on the SiC ingot.
Figure 4B:
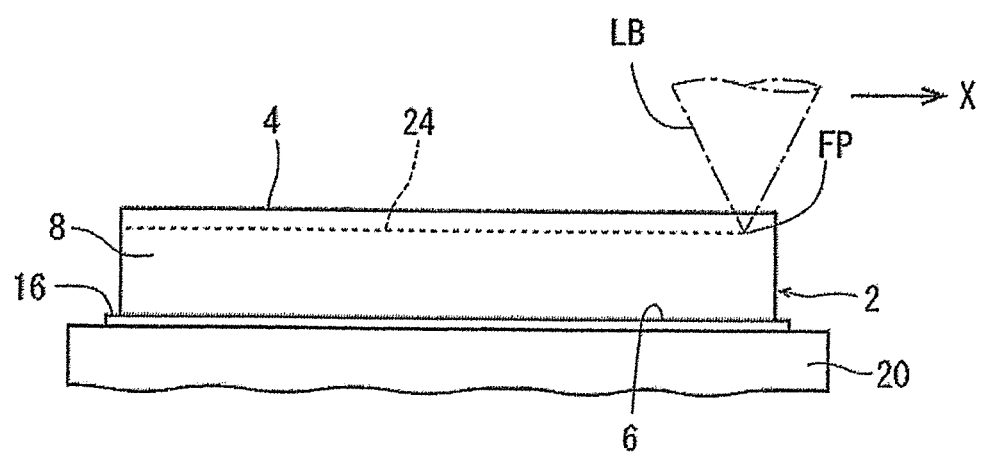
FIG. 4B is a front elevational view illustrating the peel-off layer forming step performed on the SiC ingot.

The peel-off layer forming step is carried out using a laser processing apparatus 18 which is partly illustrated in FIGS. 3, 4A, and 4B, for example. The laser processing apparatus 18 includes a circular chuck table 20 for holding the ingot 2 thereon and a beam condenser 22 (see FIG. 4A) for applying a pulsed laser beam LB to the ingot 2 on the chuck table 20. A porous circular suction chuck 24 (see FIG. 3) that is connected to suction means, not depicted, is disposed on an upper end of the chuck table 20. The chuck table 20 holds the ingot 2 on the upper surface thereof under suction forces generated by the suction means and acting on the upper surface of the suction chuck 24. The chuck table 20 is rotatable about a vertical axis by a chuck table electric motor, not depicted, connected thereto. The beam condenser 22 includes a condensing lens, not depicted, for focusing and applying the pulsed laser beam LB that is oscillated by a pulsed laser beam oscillator, not depicted, of the laser processing apparatus 18, to the ingot 2. The beam condenser 22 is movable back and forth in X-axis directions, one of which is indicated by an arrow X in FIGS. 4A and 4B, by X-axis moving means, not depicted, and Y-axis directions, one of which is indicated by an arrow Y in FIG. 4A, perpendicular to the x-axis directions, by Y-axis moving means, not depicted. The X-axis directions and the Y-axis directions jointly define a substantially horizontal XY plane. The chuck table 20 may be movable back and forth in the X-axis directions and also in the Y-axis directions.

Figure 5A:
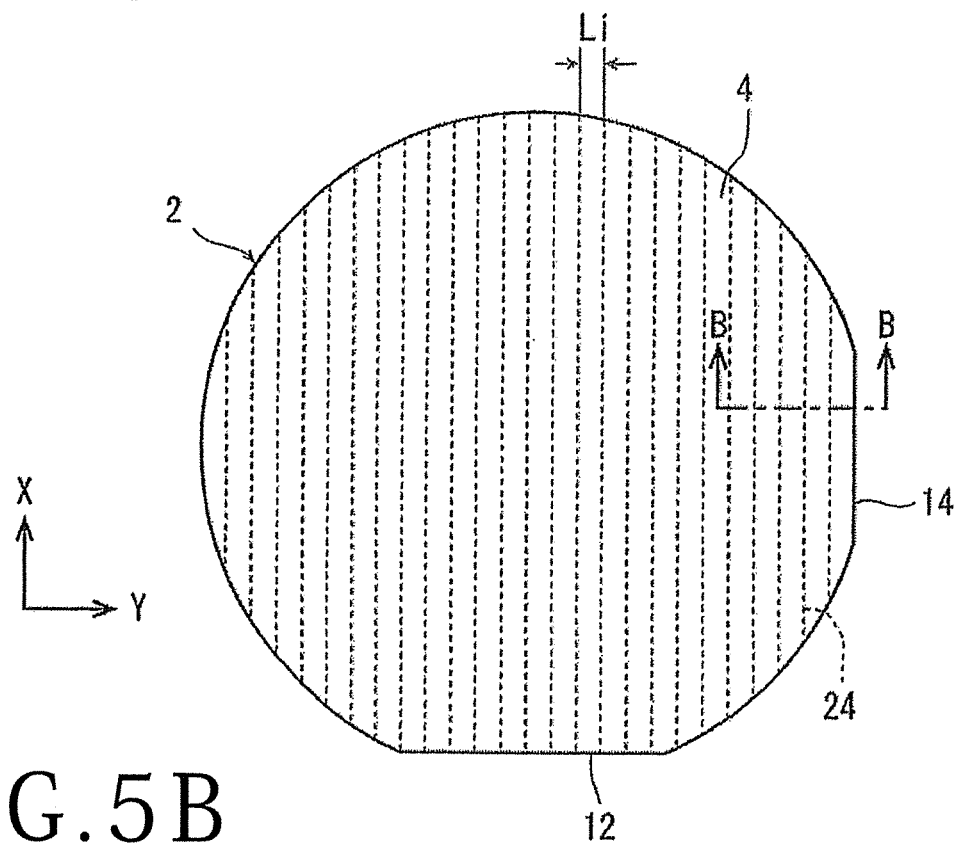
FIG. 5A is a plan view of the SiC ingot with a peel-off layer formed therein.
Figure 5B:
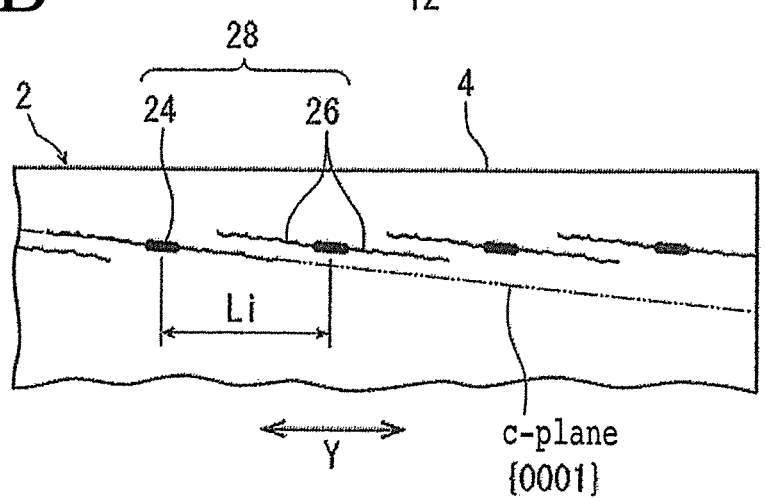
FIG. 5B is a cross-sectional view taken along line B-B of FIG. 5A.

In the peel-off layer forming step, as illustrated in FIG. 3, the ingot 2 with the substrate 16 facing downwardly is first held under suction on the upper surface of the chuck table 20. Then, image capturing means, not depicted, of the laser processing apparatus 18 captures an image of the ingot 2 from above. Based on the image of the ingot 2 captured by the image capturing means, the chuck table 20 is rotated about its own axis and the beam condenser 22 is moved to adjust the direction of the ingot 2 to a predetermined orientation and also to adjust the positions of the ingot 2 and the beam condenser 22 in the XY plane. For adjusting the direction of the ingot 2 to the predetermined orientation, as illustrated in FIG. 4A, the second orientation flat 14 is brought into alignment with the X-axis directions, thereby aligning a direction perpendicular to the direction A in which the off-angle α is formed with the X-axis directions and also aligning the direction A in which the off-angle α is formed with the Y-axis directions. Then, focal point position adjusting means, not depicted, of the laser processing apparatus 18 lifts or lowers the beam condenser 22 to position a focal point FP of the pulsed laser beam LB in the ingot 2 at a depth of 700 μm, for example, corresponding to a thickness of a wafer to be produced from the first end face 4 of the ingot 2, as illustrated in FIG. 4B. Then, a peel-off layer forming process is carried out. In the peel-off layer forming process, while moving the beam condenser 22 at a predetermined feed rate along one of the X-axis directions aligned with the direction perpendicular to the direction A in which the off-angle α is formed, the beam condenser 22 applies the pulsed laser beam LB whose wavelength is transmittable through the ingot 2 to the ingot 2. During the peel-off layer forming process, as illustrated in FIG. 5B, the pulsed laser beam LB applied to the ingot 2 separates SiC in the ingot 2 into Si (silicon) and C (carbon) and the pulsed laser beam LB subsequently applied to the ingot 2 is absorbed by previously formed C, producing a modified region 24 where SiC is successively separated into Si and C. The modified region 24 is continuously linearly formed in the ingot 2 along the direction perpendicular to the direction A in which the off-angle α is formed. At the same time, a succession of cracks 26 extending isotropically along the c-plane from the modified region 24 are developed in the ingot 2. In the peel-off layer forming process, the chuck table 20 rather than the beam condenser 22 may be linearly moved at a predetermined feed rate along one of the X-axis directions.

As illustrated in FIGS. 4A, 4B, 5A, and 5B, after the peel-off layer forming process, the laser processing apparatus 18 performs an indexing feed process. In the indexing feed process, the Y-axis moving means moves the beam condenser 22 to indexing-feed the focal point FP relatively to the ingot 2 along one of the Y-axis directions aligned with the direction A in which the off-angle α is formed by a predetermined indexing feed distance Li that is not larger than the width of the cracks 26. In the indexing feed process, the chuck table 20 rather than the beam condenser 22 may be moved along one of the Y-axis directions. Then, the peel-off layer forming process and the indexing feed process are alternately carried out to form a plurality of linear modified regions 24, each extending continuously along the direction perpendicular to the direction A in which the off-angle α is formed, at spaced intervals each equal to the indexing feed distance Li in the direction A in which the off-angle α is formed, and also to form a succession of cracks 26 extending isotropically along the c-plane from the modified regions 24, such that adjacent cracks 26 in the direction A in which the off-angle α is formed vertically overlap each other. In this manner, a peel-off layer 28 made up of the modified regions 24 and the cracks 26 is formed in the ingot 2 at the depth corresponding to a thickness of a wafer to be peeled off from the first end face 4 of the ingot 2. The peel-off layer 28 has a lower mechanical strength than the remainder of the ingot 2, so that a wafer can be peeled off from the ingot 2 along the peel-off layer 28, as described later.

The peel-off layer 28 can be formed in the peel-off layer forming step under the following processing conditions:
  Wavelength of pulsed laser beam: 1064 nm
  Repetitive frequency: 80 kHz
  Average output power: 3.2 W
  Pulse duration: 4 ns
  Focal point diameter: 3 μm
  Focal length: 10 mm
  Indexing feed distance: 250 to 400 μm
  Feed speed: 120 to 260 mm/s The peel-off layer forming step is followed by a fabrication history recording step in which a fabrication history is recorded on a planarized end face of the ingot 2 by applying a laser beam to the ingot 2 while positioning the focal point of the laser beam in a device-free area of the wafer to be produced. The fabrication history recording step may be carried out using a laser processing apparatus 18' that is partly illustrated in FIG. 6A, for example. The laser processing apparatus 18' is of essentially the same structure as the laser processing apparatus 18 that is used to carry out the peel-off layer forming step, except that a pulsed laser beam LB' which is different from the pulsed laser beam LB applied by the laser processing apparatus 18 is applied to the workpiece, i.e., the ingot 2. The laser processing apparatus 18' includes a chuck table 20' for holding the ingot 2 thereon and a beam condenser 22' for applying the pulsed laser beam LB' to the ingot 2 on the chuck table 20'. The chuck table 20' is rotatable about a vertical axis, and the beam condenser 22' is linearly movable along the X-axis directions and the Y-axis directions. The chuck table 20' may also be linearly movable along the X-axis directions and the Y-axis directions.

Figure 6A:
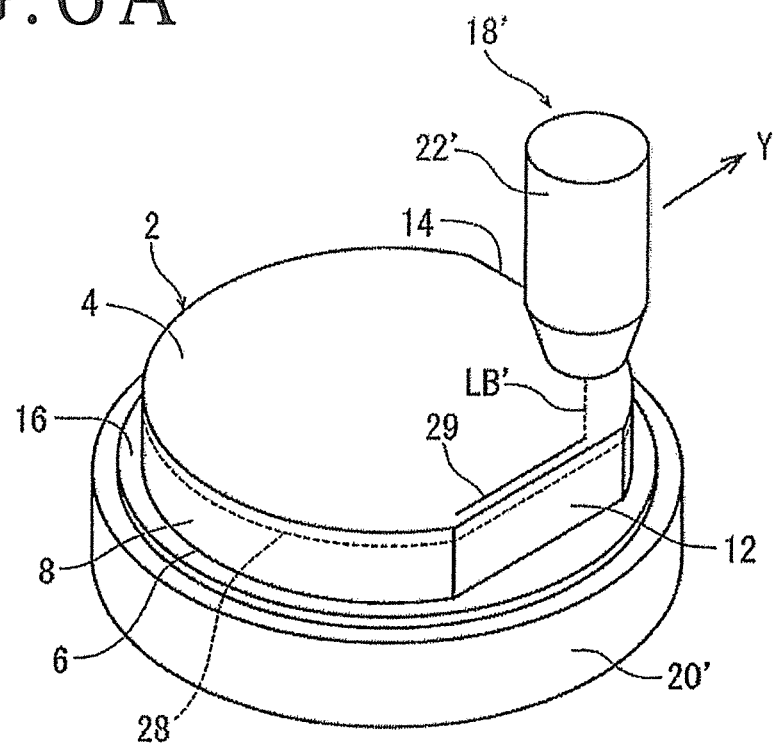
FIG. 6A is a perspective view illustrating a fabrication history recording step performed on the SiC ingot.
Figure 6B:
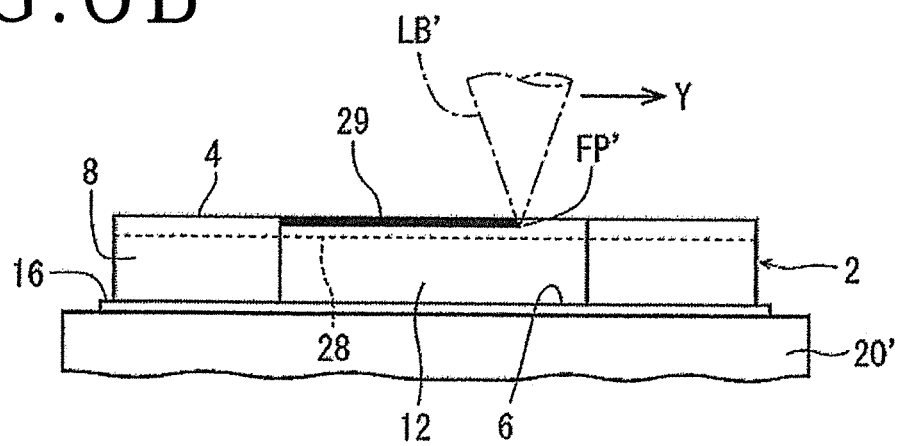
FIG. 6B is a front elevational view illustrating the fabrication history recording step performed on the SiC ingot.

The fabrication history recording step will be described in detail with reference to FIGS. 6A and 6B. In the fabrication history recording step, the ingot 2 with the substrate 16 facing downwardly is first held under suction on the upper surface of the chuck table 20'. Then, image capturing means, not depicted, of the laser processing apparatus 18' captures an image of the ingot 2 from above. The position of the beam condenser 22' is adjusted based on the image of the ingot 2 captured by the image capturing means. Then, focal point position adjusting means, not depicted, of the laser processing apparatus 18' lifts or lowers the beam condenser 22' to position a focal point FP' of the pulsed laser beam LB' in a device-free outer peripheral extra area of the wafer to be produced from the ingot 2. Thereafter, while the ingot 2 and the focal point FP' are being moved relatively to each other, the pulsed laser beam LB' is applied from the beam condenser 22' to the ingot 2. The applied pulsed laser beam LB' performs an ablation process on the device-free outer peripheral extra area of the wafer to be produced from the ingot 2, on the first end face 4 of the ingot 2, thereby recording a fabrication history 29 in the form of a bar code. The fabrication history 29 recorded in the fabrication history recording step represents a lot number of the ingot 2, a serial number of the wafer to be produced from the ingot 2, a date on which the wafer is fabricated, a factory where the wafer is fabricated, or the type of fabrication equipment involved in the fabrication of the wafer. In the illustrated embodiment, the fabrication history 29 is recorded along the first orientation flat 12. However, the fabrication history 29 may be recorded along the second orientation flat 14 or along an arcuate peripheral edge of the ingot 2 as long as the fabrication history 29 is positioned in a device-free area on the first end face 4. The fabrication history 29 has a depth ranging from approximately 200 to 300 μm, for example, that is large enough to keep the recorded fabrication history 29 unremoved when the wafer peeled off from the ingot 2 is thinned by grinding and polishing the face and reverse sides of the wafer. The fabrication history recording step can be carried out under the following processing conditions:

Wavelength of pulsed laser beam: 1064 nm
Repetitive frequency: 80 kHz
Average output power: 2.0 W
Pulse duration: 10 ns
Focal point diameter: 100 μm
Focal length: 150 mm The wavelength of the pulsed laser beam LB' among the processing conditions of the fabrication history recording step is the same as the wavelength of the pulsed laser beam LB as indicated among the processing conditions of the peel-off laser forming step, i.e., the wavelength of 1064 nm that is transmittable through the ingot 2. However, the pulsed laser beam LB' whose wavelength is transmittable through the ingot 2 can perform an ablation process on the ingot 2 by positioning the focal point FP' on the first end face 4, i.e., the upper end face, of the ingot 2. Furthermore, since the focal length from the condensing lens of the beam condenser 22' to the focal point FP' is 150 mm as indicated among the above processing conditions, a diameter of the focal point FP' may be of a comparatively large size, i.e., 100 μm as indicated among the above processing conditions. With the comparatively large focal point FP', the pulsed laser beam LB' can perform an ablation process over a large region in the device-free area on the first end face 4 of the ingot 2, thereby efficiently recording the fabrication history 29.

The fabrication history recording step is followed by a wafer producing step in which the wafer to be produced is peeled off from the ingot 2 along the peel-off layer 28 that serves as a severance starting point. The wafer producing step can be carried out using a peeling apparatus 30 which is partly illustrated in FIGS. 7 through 9. The peeling apparatus 30 includes a circular chuck table 32 for holding the ingot 2 thereon and peeling means 34 for peeling off the wafer from the ingot 2 along the peel-off layer 28 that serves as a severance starting point while holding the upper surface of the ingot 2 held on the chuck table 32. The peeling means 34 includes a liquid container 36 for storing a liquid therein in cooperation with the chuck table 32 at the time the wafer is peeled off from the ingot 2. The liquid container 36 that is vertically movable has a circular top wall 38 and a hollow cylindrical side wall 40 extending downwardly from the peripheral edge of the top wall 38, and is open at its lower end. The top wall 38 includes a tubular liquid supply port 42 that provides fluid communication between the outside and inside of the liquid container 36. The liquid supply port 42 is connected to liquid supply means, not depicted, through a fluid channel. The side wall 40 has an outside diameter that is equal to or smaller than a diameter of the chuck table 32. When the liquid container 36 is lowered, the side wall 40 has its lower end held in contact with the upper surface of the chuck table 32. An annular packing 44 is attached to the lower end of the side wall 40. When the liquid container 36 is lowered until the lower end of the side wall 40 is brought into contact with the upper surface of the chuck table 32, a liquid storing space 46 is defined between the upper surface of the chuck table 32 and an inner surface of the liquid container 36. When a liquid is supplied from the liquid supply means through the tubular liquid supply port 42 to the liquid storing space 46, the liquid is prevented from leaking from the liquid storing space 46 by the packing 44.

Figure 7:
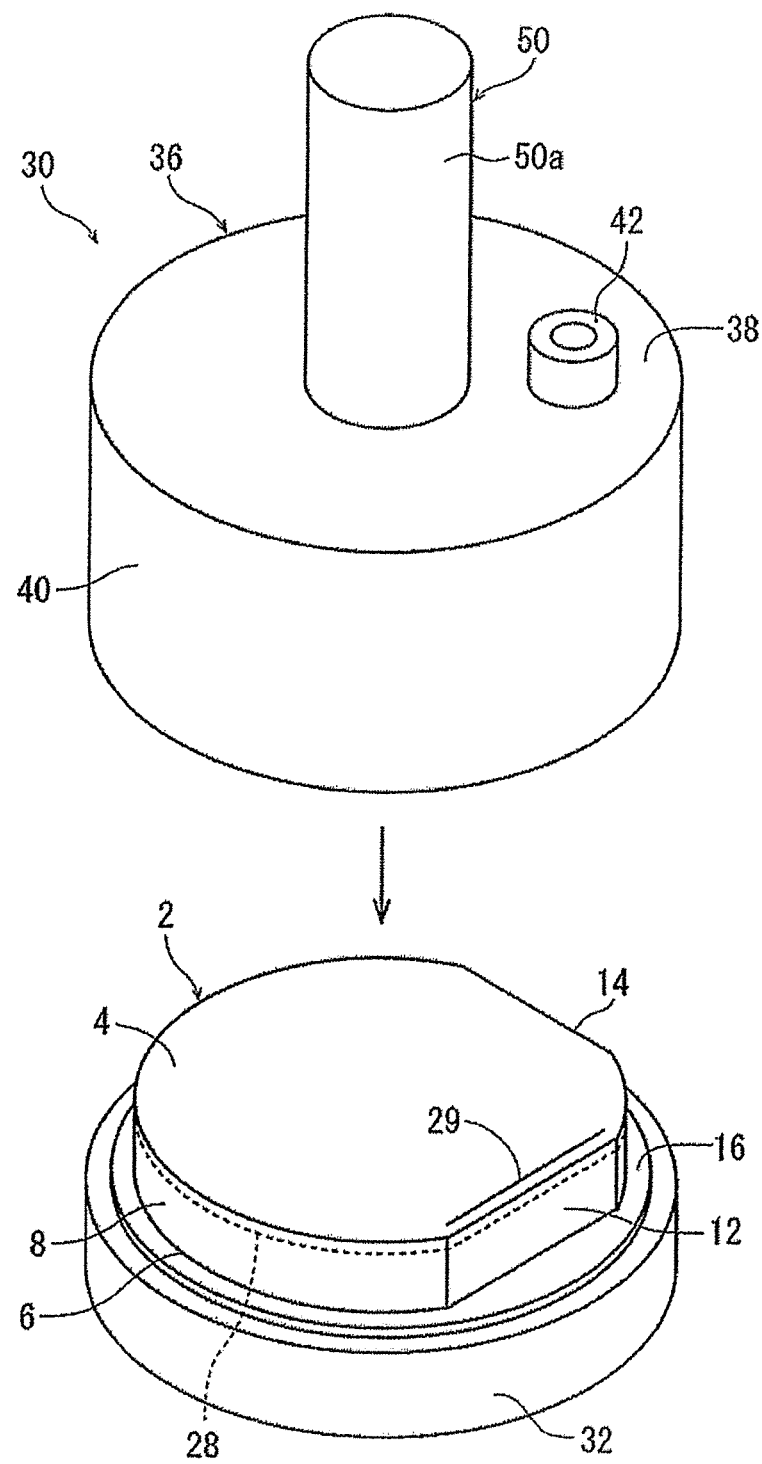
FIG. 7 is a perspective view of a peeling apparatus.
Figure 8:
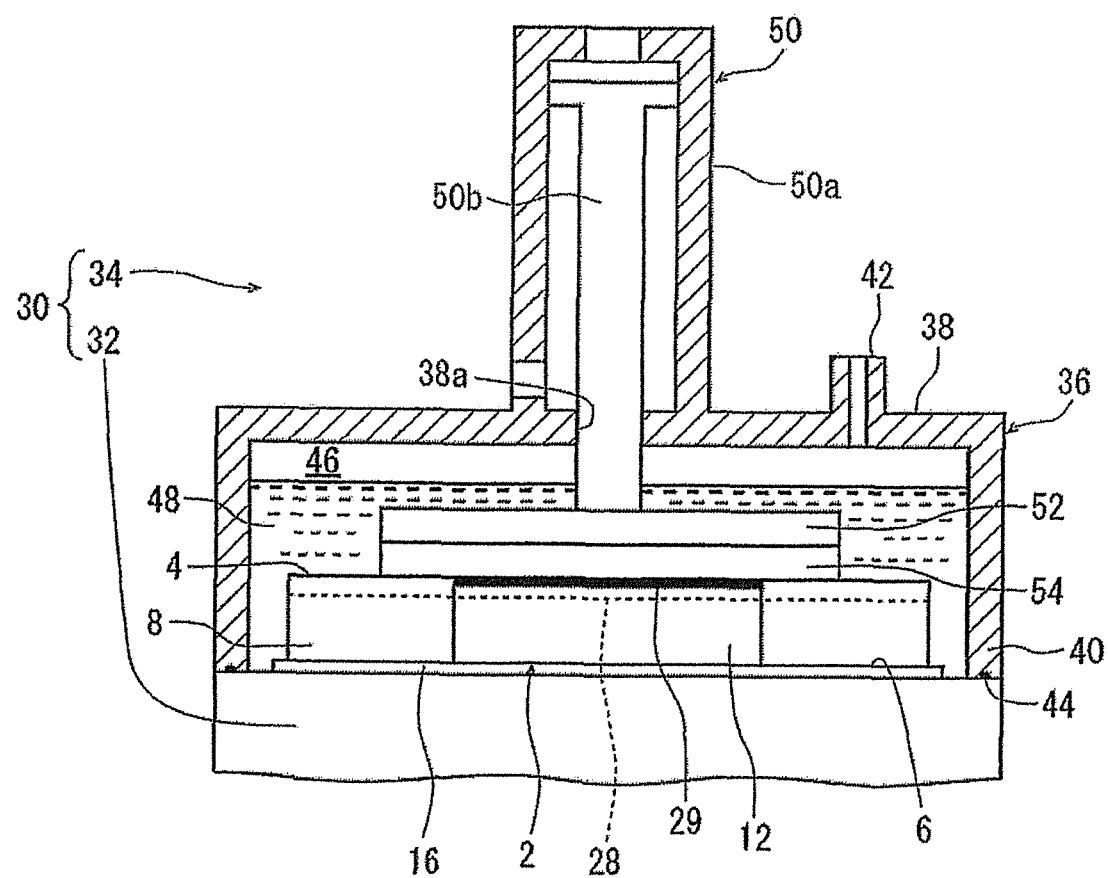
FIG. 8 is a cross-sectional view of the peeling apparatus, illustrating a wafer producing step performed on the SiC ingot.
Figure 9:
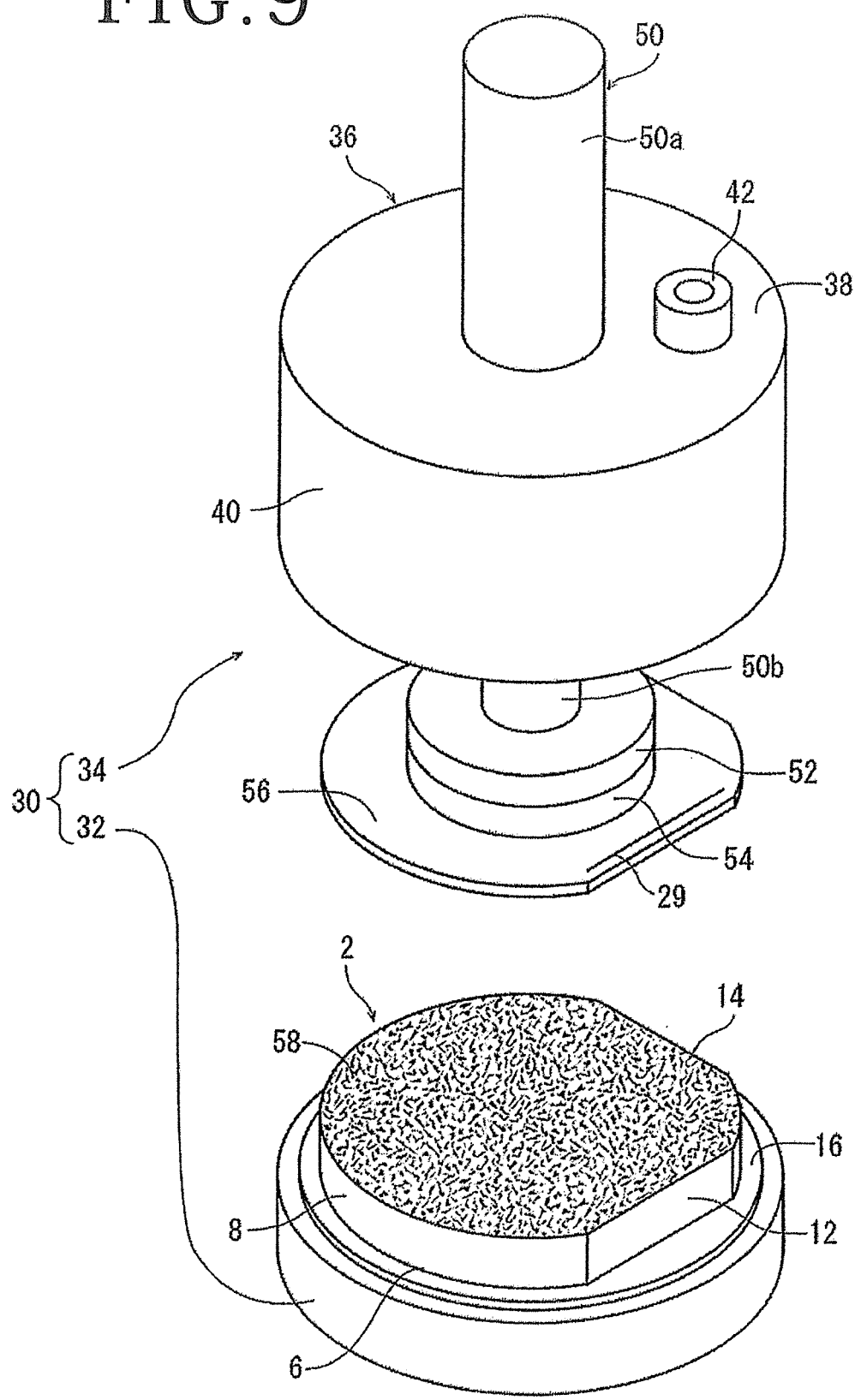
FIG. 9 is a perspective view illustrating the manner in which a wafer is peeled off from the SiC ingot.

As illustrated in FIGS. 7 through 9, an air cylinder 50 is mounted on the top wall 38 of the liquid container 36. The air cylinder 50 includes a cylinder tube 50a extending upwardly from an upper surface of the top wall 38. As illustrated in FIG. 8, the air cylinder 50 also includes a piston rod 50b slidably disposed in the cylinder tube 50a and having a lower end portion extending through a through opening 38a defined in the top wall 38 and projecting downwardly from the top wall 38. The projecting lower end portion of the piston rod 50b has a lower end to which there is fixed a disk-shaped ultrasonic vibration generator 52 that may be made of piezoelectric ceramics or the like. A disk-shaped suction member 54 is fixed to a lower surface of the ultrasonic vibration generator 52. The suction member 54 has a plurality of suction holes, not depicted, defined in a lower surface thereof that are connected to suction means, not depicted, through a fluid channel. When a suction force generated by the suction means acts through the suction holes on the lower surface of the suction member 54, the suction member 54 attracts and holds the ingot 2 under suction on the lower surface thereof.

In the wafer producing step, as illustrated in FIG. 7, the ingot 2 with the substrate 16 facing downwardly is first held under suction on the upper surface of the chuck table 32. Then, lifting and lowering means, not depicted, lowers the liquid container 36 until the lower end of the side wall 40 of the liquid container 36 is brought into contact with the upper surface of the chuck table 32. Thereafter, the piston rod 50b of the air cylinder 50 is moved to bring the lower surface of the suction member 54 into contact with the first end face 4 of the ingot 2. Thereafter, a suction force is generated by the suction means and caused to act on the lower surface of the suction member 54, holding the first end face 4 under suction on the suction member 54. Then, the liquid supply means connected to the liquid supply port 42 is actuated to supply a liquid 48, e.g., water, from the liquid supply port 42 to the liquid storing space 46 until the ultrasonic vibration generator 52 is immersed in the liquid 48. The ultrasonic vibration generator 52 is energized to apply ultrasonic vibrations to the ingot 2, stimulating the peel-off layer 28 to elongate the cracks 26 for thereby breaking the peel-off layer 28. Then, while holding the ingot 2 under suction on the suction member 54, the liquid container 36 is lifted to peel off a wafer 56 that has the recorded fabrication history 29 from the ingot 2 along the peel-off layer 28 serving as a severance starting point. When ultrasonic vibrations are applied from the ultrasonic vibration generator 52 to the ingot 2, the upper surface of the ingot 2 and the lower surface of the suction member 54 may be spaced from each other by a gap ranging from 2 to 3 mm, for example.

After the wafer producing step has been carried out, a planarizing step for planarizing an end face of the ingot 2 from which the wafer 56 has been peeled off, hereinafter referred to as "peeled face 58," is carried out. The planarizing step can be carried out using a grinding apparatus 60 which is partly illustrated in FIG. 10. The grinding apparatus 60 includes a circular chuck table 62 for holding the ingot 2 thereon and grinding means 64 for grinding and planarizing the peeled face 58 of the ingot 2 held on the chuck table 62. The chuck table 62 is rotatable about a vertical axis extending through the diametrical center of the chuck table 62, by a chuck table electric motor, not depicted, connected thereto. The grinding means 64 includes a cylindrical spindle 66 coupled to a spindle electric motor, not depicted, and extending vertically and a disk-shaped wheel mount 68 fixed to the lower end of the spindle 66. The wheel mount 68 has a lower surface to which an annular grinding wheel 72 is fastened by a plurality of bolts 70. A plurality of circumferentially spaced grinding stones 74 that are arranged in an annular array are fixed to an outer peripheral edge portion of a lower surface of the grinding wheel 72. The center of rotation of the grinding wheel 72 is offset from the center of rotation of the chuck table 62 such that the grinding stones 74 pass through the center of rotation of the chuck table 62. When the peeled face 58 of the ingot 2 held on the upper surface of the chuck table 62 and the grinding stones 74 are held in contact with each other while the chuck table 62 and the grinding wheel 72 are rotating with respect to each other, the peeled face 58 of the ingot 2 is ground in its entirety by the grinding stones 74.

Figure 10:
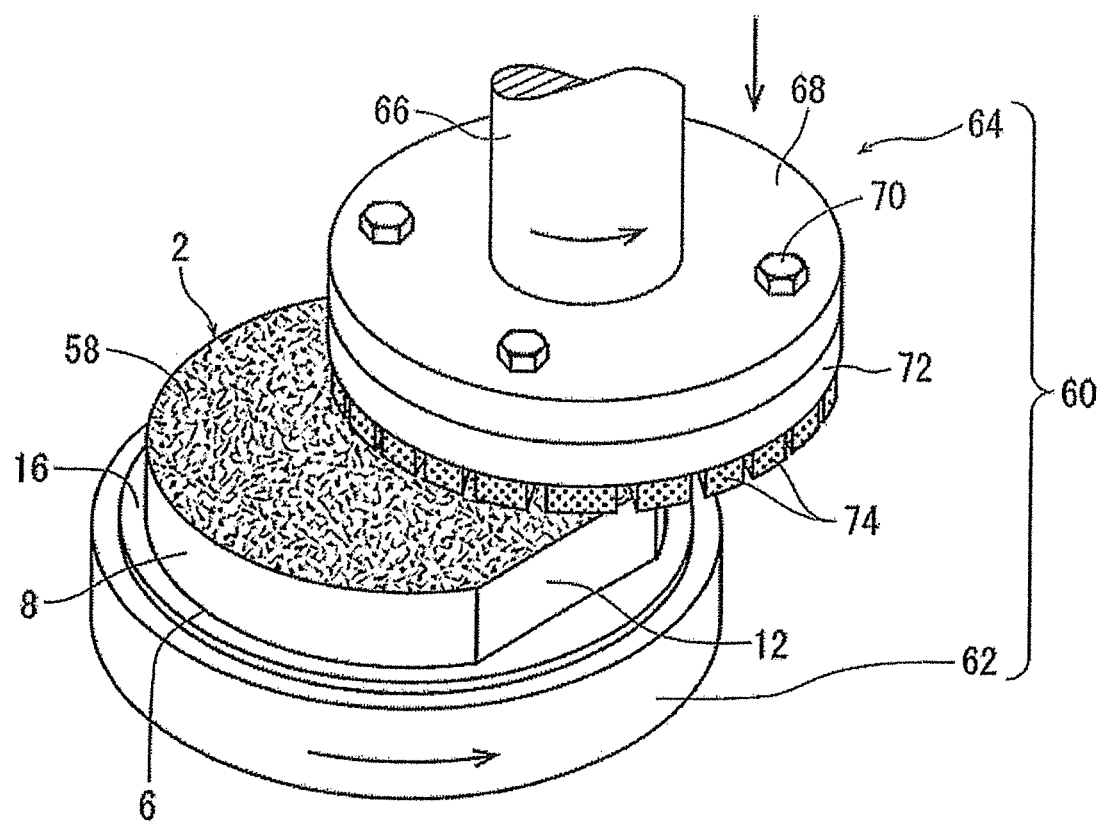
FIG. 10 is a perspective view illustrating a planarizing step performed on the SiC ingot.

The planarizing step will be described in detail below with reference to FIG. 10. The ingot 2 with the substrate 16 facing downwardly is first held under suction on the upper surface of the chuck table 62. Then, the chuck table electric motor rotates the chuck table 62 about its own axis counterclockwise as viewed from above at a predetermined speed of 300 rpm, for example. The spindle electric motor rotates the spindle 66 about its own axis counterclockwise as viewed from above at a predetermined speed of 6000 rpm, for example. Then, lifting and lowering means, not depicted, of the grinding apparatus 60 is actuated to lower the spindle 66 to bring the grinding stones 74 into contact with the peeled face 58 of the ingot 2. After having brought the grinding stones 74 into contact with the peeled face 58, the lifting and lowering means lowers the spindle 66 at a predetermined grinding feed speed of 1.0 µm/s, for example. The grinding stones 74 thus grind the peeled face 58 of the ingot 2, thereby planarizing the peeled face 58 to the extent that it will not obstruct the entry of the pulsed laser beam LB' in the fabrication history recording step. The peel-off layer forming step, the fabrication history recording step, the wafer producing step, and the planarizing step are repeated to produce a plurality of wafers 56 each having a fabrication history 29 recorded thereon from the ingot 2.

According to the illustrated embodiment, as described above, the method of producing a wafer includes at least the planarizing step of planarizing an end face of the ingot 2, the peel-off layer forming step of forming the peel-off layer 28 in the ingot 2 by applying the pulsed laser beam LB whose wavelength is transmittable through the ingot 2 while positioning the focal point FP of the pulsed laser beam LB in the ingot 2 at the depth corresponding to a thickness of a wafer 56 to be produced from the planarized end face of the ingot 2, the fabrication history recording step of recording the fabrication history 29 on the planarized end face of the ingot 2 by applying the pulsed laser beam LB' to the ingot 2 while positioning the focal point FP' of the pulsed laser beam LB' in the device-free area of the wafer 56 to be produced, and the wafer producing step of producing the wafer 56 by peeling off the wafer 56 from the ingot 2 along the peel-off layer 28 that serves as a severance starting point. Consequently, the history of the produced wafer 56 that is linked to the ingot 2 is reliably left on the wafer 56, and hence can be confirmed during a step of forming devices on the wafer 56. If defects occur in devices on the wafer 56, then it is possible to examine the cause of the defects by looking back on the ingot 2 based on the history of the wafer 56. Therefore, preventive measures can be taken to prevent similar defects from occurring in devices on wafers.

In the peel-off layer forming step according to the illustrated embodiment, the modified region 24 is continuously formed in the direction perpendicular to the direction A in which the off-angle α is formed, and the focal point FP is indexing-fed relatively to the ingot 2 along the direction A in which the off-angle α is formed. However, the modified region 24 may not be formed in the direction perpendicular to the direction A in which the off-angle α is formed, and the focal point FP may not be indexing-fed relatively to the ingot 2 along the direction A in which the off-angle α is formed.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer producing method comprising the steps of:
    planarizing an end face of a hexagonal single-crystal ingot;
    forming a peel-off layer in the hexagonal single-crystal ingot by applying a first pulsed laser beam whose wavelength is transmittable through the hexagonal single-crystal ingot while positioning a focal point of the first pulsed laser beam in the hexagonal single-crystal ingot at a depth corresponding to a thickness of a wafer to be produced from the planarized end face of the hexagonal single-crystal ingot;
    recording a fabrication history on the planarized end face of the hexagonal single-crystal ingot by applying a second pulsed laser beam to the hexagonal single-crystal ingot while positioning a focal point of the second pulsed laser beam in a device-free area of the wafer to be produced; and
    producing a severed wafer by peeling off the wafer to be produced from the hexagonal single-crystal ingot along the peel-off layer that serves as a severance starting point.

2. The method according to claim 1, wherein
    the fabrication history represents a lot number of the hexagonal single-crystal ingot, a serial number of the wafer to be produced from the hexagonal single-crystal ingot, a date on which the severed wafer is fabricated, a factory where the severed wafer is fabricated, or the type of fabrication equipment involved in the fabrication of the severed wafer.

3. The method according to claim 2, wherein
    the hexagonal single-crystal ingot includes a hexagonal single-crystal SiC ingot having a first end face, a second end face opposite the first end face, a c-axis extending from the first end face to the second end face, and a c-plane perpendicular to the c-axis, the c-axis being inclined to a line normal to the first end face, and the c-plane and the first end face forming an off-angle therebetween; and
    the step of forming the peel-off layer includes the steps of positioning the focal point of the first pulsed laser beam whose wavelength is transmittable through the hexagonal single-crystal SiC ingot in the hexagonal single-crystal SiC ingot at the depth corresponding to the thickness of the wafer to be produced from the first end face of the hexagonal single-crystal SiC ingot, moving the hexagonal single-crystal SiC ingot and the focal point of the first pulsed laser beam relatively to each other in a direction perpendicular to a direction in which an off-angle is formed, thereby to separate SiC in the hexagonal single-crystal SiC ingot into Si and C and to absorb a subsequently applied first pulsed laser beam with previously formed C, thereby forming a modified region where SiC is successively separated into Si and C and a succession of cracks extending along the c-plane from the modified region, and indexing-feeding the hexagonal single-crystal SiC ingot and the focal point of the first pulsed laser beam relatively to each other by a predetermined distance in the direction in which the off-angle is formed thereby to form the peel-off layer in the hexagonal single-crystal SiC ingot.

* * * * *